United States Patent
Nozaki et al.

(10) Patent No.: US 6,887,644 B1
(45) Date of Patent: May 3, 2005

(54) POLYMER COMPOUND FOR A CHEMICAL AMPLIFICATION RESIST AND A FABRICATION PROCESS OF A SEMICONDUCTOR DEVICE USING SUCH A CHEMICAL AMPLIFICATION RESIST

(75) Inventors: Koji Nozaki, Kawasaki (JP); Ei Yano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 330 days.

(21) Appl. No.: 09/015,287

(22) Filed: Jan. 29, 1998

(30) Foreign Application Priority Data

Jun. 23, 1997 (JP) .............................. 9-165935

(51) Int. Cl.[7] .............. G03F 7/039; G03F 7/30; G03F 7/40
(52) U.S. Cl. ............... 430/270.1; 430/905; 430/910; 526/270
(58) Field of Search ................ 430/270.1, 95, 430/910, 905; 526/270, 313, 316

(56) References Cited

U.S. PATENT DOCUMENTS 3,758,514 A * 9/1973 Heiba et al. ............ 526/270
6,013,416 A * 1/2000 Nozaki et al. ........... 430/283.1

FOREIGN PATENT DOCUMENTS

| JP | 5-107762 A | 4/1993 |
|----|-----------|--------|
| JP | 5-346668 A | 12/1993 |
| JP | 06324494 A | 11/1994 |
| JP | 07120927 A | 5/1995 |
| JP | 07196743 A | 8/1995 |
| JP | 07234511 A | 9/1995 |
| JP | 08262717 A | 10/1996 |
| JP | 09043848 A | 2/1997 |
| JP | 09090637 A | 4/1997 |

\* cited by examiner

*Primary Examiner*—John S. Chu
(74) *Attorney, Agent, or Firm*—Westerman, Hattori, Daniels & Adrian, LLP

(57) ABSTRACT

A resist composition includes a polymer principal chain, a carboxyl group having a protective group and bonding to a side chain of the polymer main chain, and an additional acidic functional group having an acid-cleavable protective group and bonding to a side chain of the polymer main chain, wherein the carboxyl group has a lactone structure represented by a formula

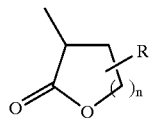

(wherein n is an integer of 1–4, and R represents any of a hydrogen atom, an alkyl group, an alkoxyl group and an alkoxycarbonyl group and connected to an arbitrary position of said lactone structure excluding a second position forming an ester bonding) as the protective group.

27 Claims, 1 Drawing Sheet

POLYMER COMPOUND FOR A CHEMICAL AMPLIFICATION RESIST AND A FABRICATION PROCESS OF A SEMICONDUCTOR DEVICE USING SUCH A CHEMICAL AMPLIFICATION RESIST

BACKGROUND OF THE INVENTION

The present invention generally relates to a resist composition that can be developed by a basic developing liquid and a fabrication process of a semiconductor device using such a resist composition.

With the advancement in the art of device miniaturization, recent semiconductor integrated circuits designated as LSIs or VLSIs are now patterned with sub-micron line widths. Further, intensive investigations are being made on so-called sub-halfmicron devices that use a minimum pattern width of smaller than 0.5 $\mu$m.

In order to fabricate such sub-halfmicron devices, it is essential to reduce the wavelength of the optical radiation that is used for exposing a pattern on a semiconductor substrate, from a conventional, normal ultraviolet wavelength to a far-ultraviolet wavelength. Further, investigations are being made also on the exposure process that uses a deep ultraviolet wavelength radiation. Associated with such a shift in the wavelength of the optical radiation used for photolithography, there is an urgent demand for a resist composition that shows a reduced optical absorption in such a very short wavelength band and simultaneously a high dry etching resistance and a high sensitivity.

In recent years, intensive studies have been made on the photolithography that uses a novel optical source of KrF excimer laser. A KrF excimer laser produces an optical radiation with a wavelength of 248 nm, and the technology of the KrF excimer laser photolithography is now being reduced to practice. In relation to the development of photolithography that uses such a very short wavelength optical radiation, there is proposed a concept of chemical amplification resist (J. M. J. Frechet, et al., Proc. Microcircuit Eng., 260 (1982), H. Ito, et al., Digest of Technical Papers of 1982 Symposium on VLSI Technology, 86 (1983), H. Ito, et a., "Polymer in Electronics," ACS Symposium Series 242, T. Davidson ed., ACS, 11 (1984), U.S. Pat. No. 4,491,628) that shows a high sensitivity and high resolution in the exposure process conducted by such very short wavelength optical radiations.

The basic concept of chemical amplification resist is to increase the apparent quantum yield by inducing a catalytic reaction in the resist film.

In the example of widely studied, as well as widely used, chemical amplification positive type resist, in which a PAG (photo acid generator) is added to t-butoxycarbonyl (t-BOC) polyvinyl phenol (PVP), the t-BOC group functions as a protective group and causes a desorption as a result of the post exposure baking (PEB) process conducted after the exposure. As a result of the PEB process, isobutene and carbon dioxide are formed. As such a desorption process releases a protonic acid, a chain reaction is triggered in the resist composition with regard to the deblocking reaction, and the polarity of the resist is changed significantly in the exposed part of the resist film. Thus, by applying a suitable developing liquid to the resist film thus exposed, a resist pattern is successfully formed.

On the other hand, recent attempts of forming semiconductor devices of still higher integration density such as Gbit DRAMs, have urged an investigation on the photolithography that uses a still shorter wavelength optical radiation of 193 nm wavelength band produced by an ArF excimer laser. In the photolithographic process that uses such a very short wavelength optical radiation, the problem of strong optical absorption by the resist is inevitable as long as a phenolic polymer resin is used for the resist base. Thus, there is an urgent demand for a resist that is applicable to such a very short-wavelength optical radiation.

While there are various chemical amplification resists studied for application to an exposure process conducted with the optical radiation of 193 nm wavelength, most of the conventionally studied resists are based on a methacrylic resin that has an ester group called polycyclic alicyclic group. Examples thereof are adamantane, isobornane, tricyclodecane, and others. See for example, Nozaki, K., et al, Chem. Mater., 1994, 6, 1492–1498, Nakano, K., et al, Proc. SPIE, 1994, 2195, 194–204, and Allen, R. D., et al, Proc. SPIE, 1994, 2438, 474–485. The foregoing conventional resists successfully realize the necessary dry-etching resistance that is essential for a resist, by incorporating alicyclic ester group into the base resin.

On the other hand, the foregoing conventional resists have suffered from the problems, associated with the use of the alicyclic group in the resin, such as a peeling-off of the resist during the developing process or an insufficient dissolving of the exposed area to an alkaline developer. In order to overcome the foregoing problems, there are proposals such as incorporation of carboxylic acid unit into the base resin or using a diluted developing liquid. Further, there are proposals for mixing an alcohol such as isopropyl alcohol to the developer.

Further, there is a report of a chemical amplification resist composition that solves the foregoing problems successfully (Nozaki, K., et al., Jpn. J. Appl. Phys., 35, 1996, L528-L530). The reported resist uses mevalonic lactone and 2-methyl-2-adamantanol for the protective group of the carboxylic acid in the base resin.

In the foregoing resist composition, both of the protective groups cause deprotection, while such deprotection enables a development of the resist by using a standard alkaline developer. As mevalonic lactone has a strong polarity, the resist composition shows an improved adhesion to a substrate. Further, the resist composition has a sufficient sensitivity and enables formation of ultra-fine patterns without swelling.

On the other hand, there has been a problem in the foregoing conventional resist composition in that the synthesis of mevalonic lactone methacrylate has to be conducted at a low temperature, and that the mevalonic lactone source material is expensive.

SUMMARY OF THE INVENTION

Accordingly, it is a general object of the present invention to provide a novel and useful resist composition wherein the foregoing problems are eliminated.

Another and more specific object of the present invention is to provide a novel and useful acid-sensitive polymer for a resist composition that has a practical sensitivity to a deep-ultraviolet optical radiation and forms an ultra-fine pattern free from swelling or peeling-off after a development process conducted by a standard alkaline developer.

Another object of the present invention is to provide a novel resist composition that is sensitive to a deep-ultraviolet radiation produced by a KrF excimer laser or an ArF excimer laser and simultaneously has an excellent dry-etching resistance.

Another object of the present invention is to provide a novel resist composition capable of forming ultra-fine patterns with high sensitivity, sharp contrast and high resolution, by realizing a large difference of polarity between an exposed area and an unexposed area of the resist composition.

Another object of the present invention is to provide a method of forming a resist pattern by using such a resist composition as well as a fabrication method of a semiconductor device using such a resist pattern.

In an investigation conducted by the inventors of the present invention and now forming the basis of the present invention, it has been discovered that it is important to use a film-forming polymer that includes a carboxyl group in a side chain of a monomer unit forming a part of the polymer as the base resin of the chemical amplification resist, and that the carboxyl group includes a compound having a specific lactone part as a protective group. Further, it has been discovered that it is important that the film-forming polymer contains an additional acidic functional group that has an acid-cleavable protective group in a side chain of the resin.

In a first aspect of the present invention, there is provided a resist composition insoluble to a basic solution but becoming soluble after an exposure process to an optical radiation, the resist composition comprising: a film-forming polymer having a carboxyl group in a side chain of a monomer unit, the film-forming polymer further including an additional acidic functional group in a side chain of a monomer unit such that the additional acidic functional group includes an acid-cleavable protective group; and a photoacid generator that releases an acid in response to a decomposition caused by an absorption of the optical radiation used in the exposure process, the resist film becoming soluble to the basic solution upon a deprotection of the acid-cleavable protective group from the side chain of the monomer, wherein the carboxyl group contains a protective group represented by a formula (I),

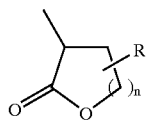

(I)

where n is an integer of 1–4, R is any of a hydrogen atom, an alkyl group, an alkoxy group, or an alkoxycarbonyl group connected to an arbitrary position excluding a third position that forms an ester bonding.

The acid-sensitive polymer used for the base resin of the resist composition of the present invention includes various polymers ranging from various copolymer compounds containing a monomer unit that includes therein the foregoing lactone structure and the additional acidic functional group attached to the resist side chain and including the acid-cleavable protective group, to a terpolymer including the foregoing monomer unit and other arbitrary monomer units.

It should be noted that the polymer used in the present invention preferably contains at least one monomer unit that contains the foregoing carboxyl group including the protective group. The monomer unit may be selected from any of acrylate monomer unit, methacrylate monomer unit, vinylphenol monomer unit, N-substitute maleimide monomer unit, and styrene monomer unit. Alternatively, the monomer unit may be the one that has an ester group including therein a monocyclic alicyclic hydrocarbon. Monomer units that include a structure of adamantyl group or norbornyl in the polycyclic alicyclic hydrocarbon part are most preferable.

Further, it is preferred that the resist composition of the present invention shows an optical absorption, when used to form a resist film on an $SiO_2$ substrate, of 1.75 or less in the deep-ultraviolet wavelength band of 180–300 nm, which is used in the conventional exposure process. When the absorption is increased above the foregoing value, the transmittance of the resist film decreases substantially and the patterning becomes difficult.

In the acid-sensitive copolymer noted above, it is also preferable that a monomer unit, which causes a polymerization with the monomer unit that includes the carboxyl group in which the foregoing lactone protective group is included, includes another carboxyl group having the acid-cleavable protective group. Thus, the acid-sensitive copolymer of the present invention may include a monomer unit having a first carboxyl group that includes the foregoing lactone part as a first protective group and further a monomer unit having a second carboxyl group that includes the foregoing acid-cleavable protective group as a second protective group.

It should be noted that the foregoing monomer unit having the second carboxyl group preferably includes the carboxyl group such that the protective group causes a deprotection in response to the acid released by the photoacid generator, which may be added to a side chain of the same monomer unit, and that the protective group of the carboxyl group has a structure represented by the formula (II),

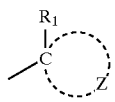

(II)

wherein $R_1$ represents a substituted or unsubstituted alkyl group and may have a straight chain or a branched chain containing 1–4 carbon atoms, while Z represents the atoms that are necessary to complete the alicyclic hydrocarbon group together with the carbon atoms attached to $R_1$.

There are various forms possible for the second carboxyl group, while the preferable form is represented according to the formula (III) below,

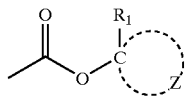

(III)

wherein $R_1$ and Z are defined already in the formula (II).

The preferred resist composition of the present invention is supplied in a form of solution dissolved into a solvent, which is selected from a group of ethyl lactate, methylamylketone, methyl-3-methoxypropionate, ethyl-3-ethoxypropionate, propyleneglycolmethylether acetate and a mixture thereof. The resist solution may further contain butylacetate, γ(gamma)-butylolactone, propyleneglycol methylether and a mixture thereof as additional solvent.

In another aspect of the present invention, there is provided a method of forming a resist pattern comprising the steps of:
coating a resist composition of the present invention as set forth before on a substrate to form a resist film;
exposing the resist film to an exposure optical radiation that induces a decomposition of the photoacid generator in the resist composition; and
developing the exposed area in a basic solution.

Further, the present invention provides a fabrication process of a semiconductor device comprising the steps of:
coating a resist composition of the present invention as set forth before on a substrate to form a resist film;
exposing the resist film by an exposure optical radiation that induces a decomposition of the photoacid generator in the resist composition;
developing the resist film exposed to the exposure optical radiation by a basic solution; and etching the substrate while using the resist pattern as a mask.

In the process of resist pattern formation or semiconductor device fabrication of the present invention as set forth above, it is further preferred to apply a heat treatment to the resist film formed on the substrate before and after the exposure process. In other words, the foregoing process may include a prebaking process and a post-exposure baking (PEB) process. The prebaking process and the PEB process may be conducted as commonly practiced in the art.

In the acid-sensitive copolymer of the present invention, it is preferred to set the proportion of the monomer unit, which has the lactone part represented by the formula (I) with respect to the total copolymer to fall in the range between 0.1–80 mol %, more preferably 10–50 mol %. When the proportion of the monomer unit becomes lower than about 10 mol %, the adhesion of the resist film to the substrate is impaired and the satisfactory patterning becomes difficult. When, on the other hand, the proportion exceeds 60 mol %, the formation of ultra-fine patterns becomes difficult due to the decrease of the monomer units that contain the acid-cleavable additional protective group. When the proportion exceeds 80 mol % in particular, the resin becomes soluble to the basic solution before the exposure process.

It is recommended to set the proportion of the photoacid generator to fall in the range of 0.1–50 wt % with respect to the polymer weight, more preferably to 1–15 wt %. Further, the weight average molecular weight of the polymer used in the present invention may fall in the range of 2,000–1,000,000, more preferably the range of 5,000–50,000.

The additional solvent to be added to the resist solution may not be necessary when the solubility of the solutes is good. When the solubility of the solutes is poor, on the other hand, it is recommended to use such an additional solvent with a proportion of 1–30 wt %, more preferably 10–20 wt %, with respect to the main solvent.

The basic solution used for the developer may include an aqueous solution of a metal hydroxide of group I or II metals such as KOH or an aqueous solution of an organic base not containing a metal ion, such as tetraalkylammonium hydroxide. Particularly, the use of tetramethylammonium hydroxide (TMAH) is preferred. Further, various additives such as a surfactant may be added for improving the efficiency of developing.

Other objects and further features of the present invention will become apparent from the following detailed description when read in conjunction with the attached drawings.

DETAILED DESCRIPTION OF THE PREFERRED EMBODIMENT

General

Figure 1A:
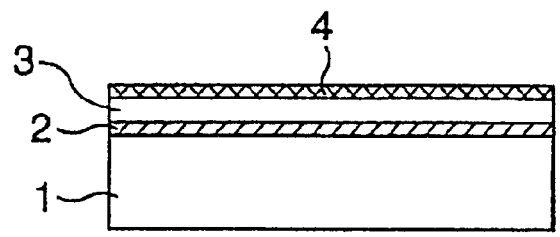
FIGS. 1A–1F are diagrams showing the fabrication process of a semiconductor device according to an embodiment of the present invention.

The present invention relates to a chemical amplification resist composition that forms a positive resist pattern on a substrate upon a developing process conducted by a basic aqueous solution.

The resist composition of the present invention includes:
(a) an acid-sensitive film-forming polymer insoluble to a basic aqueous solution and having a carboxyl group on a side chain of a monomer unit that constitutes the film-forming polymer, the carboxyl group containing a protective group, the film-forming polymer further having an additional acidic functional group different from the carboxyl-group on a side chain of a monomer unit constituting the film-forming polymer, the additional acidic functional group containing an acid-cleavable protective group, which, upon deprotection from the side chain, causes a change in the film-forming polymer to become soluble to an alkaline aqueous solution; and
(b) a PAG releasing an acid in response to an optical exposure, which acid causing a deprotection of the acid-cleavable protective groups, in response to a decomposition caused in turn in response to an absorption of an exposure optical radiation, wherein the film-forming polymer contains a lactone part represented by the formula (I) or (II) as the protective group of the carboxyl group.

The protective groups release protonic acids upon the deprotection, and the resist composition achieves a high sensitivity as a result of the chemical amplification thus occurred. After the deprotection of the protective groups, the exposed area in the resist film becomes soluble to alkalis, and it becomes possible to form a positive resist pattern from the resist film by conducting a development process while using a basic solution for the developer.

It should be noted that the lactone represented by the formula (I) shows a strong polarity and further a weak solubility to alkalis. Thus, the solubility of the exposed area in the resist film after the deprotection of the acid-cleavable protective group, is further enhanced. In the polymer of the present invention the pattern formation is achieved by using the polarity change. Thus, the resist pattern formed in the present invention is free from swelling.

The structure of the acid-sensitive polymer used in the resist composition of the present invention as a base resin is not limited as long as the foregoing requirement for the chemical amplification mechanism is met. However, in view of the demanded dry etching resistance of the resist, which should be at least comparable with that of the conventional Novolak resist, and further in consideration of the fact that the resist should be acid-sensitive, the use of a polymer including an acrylate or methacrylate monomer unit that has a polycyclic alicyclic hydrocarbon compound in an ester group is recommended. Alternatively, the use of comonomers to prepare copolymers such as a vinylphenol, N-substituted maleimide or a styrene is recommended. Particularly, the use of the acrylate or methacrylate polymer is preferable in the exposure process conducted by an optical radiation having a wavelength of 250 nm or less, in view of reduced optical absorption. In the exposure process conducted by a deep ultraviolet radiation, it is generally preferable to use a polymer that does not contain benzene ring, which strongly absorbs the deep ultraviolet radiation, or chromophore such as conjugated double bond that shows a large molar extinction coefficient.

In the case a deep ultraviolet optical source such as an ArF excimer laser is used for the optical source, the transparency of the resist at the wavelength of 193 nm becomes an especially important factor in addition to the dry etching resistance. In such a case, it is recommended to use a polymer, particularly an acrylate or methacrylate polymer, which contains a polycyclic alicyclic hydrocarbon having a high dry etching resistance such as adamantyl group or norbornyl group, in addition to the cleavable ester group.

The foregoing acrylate or methacrylate polymer as well as other acid-sensitive polymers may have a wide range of molecular weight (weight-average molecular weight, Mw), preferably in the range between 2,000 and 1,000,000, more preferably in the range between 3,000 and 50,000.

In the case of using an acrylate or methacrylate polymer, the formula of the polymer is represented as

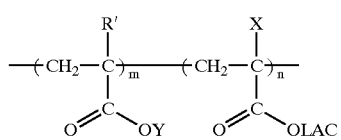

(IV)

wherein R' represents a hydrogen atom or an arbitrary substituent such as halogen, an alkyl group, a methyl group, and the like; Y represents an arbitrary acid-cleavable protective group such as tBu group, a tetrahydropyranyl group, an isobornyl group, 2-methyl-2-adamantyl group, and the like; m and n represent a normalized mole ratio of each monomer unit (m+n=1); X represents, when not specified otherwise-, a hydrogen atom, a halogen atom such as Cl or Br, a lower grade alkyl group such as a methyl group or ethyl group, or a cyano group; and LAC represents the lactone part of the formula (I).

The acrylate or methacrylate polymer of the present invention can be easily synthesized by a commonly used polymerization process. For example, the polymer may be formed advantageously by heating monomers in the presence of AIBN (2, 2'-azobisisobutyronitrile) which is used commonly for a free radial initiator. Further, the acid-sensitive polymers other than the foregoing acrylate or methacrylate polymer may be prepared according to a well established process.

In the resist composition of the present invention as a base resin, it is preferable to use a monomer unit having the structure of the formula (II) for the protective group of the acidic functional group.

While there are various possible forms for the protected acidic functional groups, it is preferable to use a compound having the formula (III) for this purpose.

In more detail, the copolymer formed of the monomer units that have a carboxyl group containing therein a protective group, is represented by a formula (V). More specifically, the acid-sensitive polymer may be formed of the copolymer represented by the formula (V) as

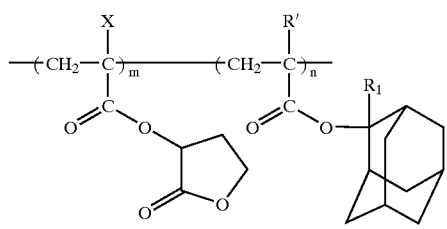

(V)

wherein $R_1$, R', X, m and n are already defined, the substituent R' and X may be identical or different and preferably formed of a hydrogen atom or a methyl group.

In implementing the present invention, it is advantageous to use a γ(gamma)-butylolactone-2-yl methacrylate/2-methyl-2-adamantyl methacrylate copolymer represent by the formula (VI)

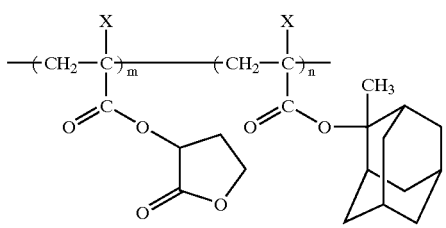

(VI)

for the acid-sensitive copolymer, wherein X represent a methyl group or a hydrogen atom and may be the same or may be different from each other.

The resist composition containing such a copolymer or other polycyclic alicyclic ester shows a high dry etching resistance (RIE resistance). In order to achieve an RIE resistance of the commonly used Novolak resin, it is necessary to set the content of the 2-methyl-2-adamantyl methacrylate, which forms the second monomer unit in the copolymer, to about 50 mol %. As the copolymer does not contain a conjugate double bond or benzene ring in the structure, the copolymer is transparent to the optical radiation of 193 nm wavelength produced by an ArF excimer laser.

In the foregoing copolymer, it is preferable to set the proportion of the γ-butylolactone-2-yl methacrylate forming the first monomer unit of the copolymer to 20–70 mol %, more preferably to 30–60 mol %. When the proportion of the foregoing monomer unit is reduced below about 20 mol %, there appears a tendency that the resist pattern peels off. When, on the other hand, the proportion of the monomer unit exceeds about 80 mol %, the resin becomes soluble to a basic aqueous solution. Most preferably, the monomer unit is contained with a proportion of 40–60 mol %.

It should be noted that the mechanism of the chemical amplification process for the foregoing copolymer resist is identical to that of a general chemical amplification process. The copolymer further has an advantageous effect of solubility to alkalis provided by the lactone group in the monomer unit.

It is well known that a polymer of acrylate or methacrylate shows a high transparency in the deep ultraviolet wavelength band. As the copolymer represented by the formula (VI) does not contain a chromophore showing a large molar extinction coefficient in the wavelength band of 190–250 nm in the two ester parts thereof, it is possible to obtain a high sensitivity resist composition applicable to a deep ultraviolet exposure process from the foregoing copolymer, by adding a suitable amount of PAG.

When the foregoing polymer is used for the base resin of a resist film, there proceed following reactions in the exposed part of the resist simultaneously or separately, by consuming a small amount of $H_2O$ contained in the resist film. Thereby, the reaction stops when $H_2O$ in the exposed region is consumed. As a protonic acid is regenerated after the deprotection of the adamantyl group, the resist film shows a very high sensitivity.

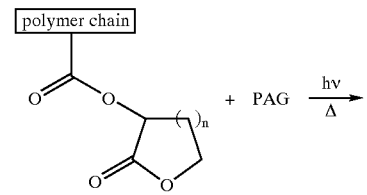

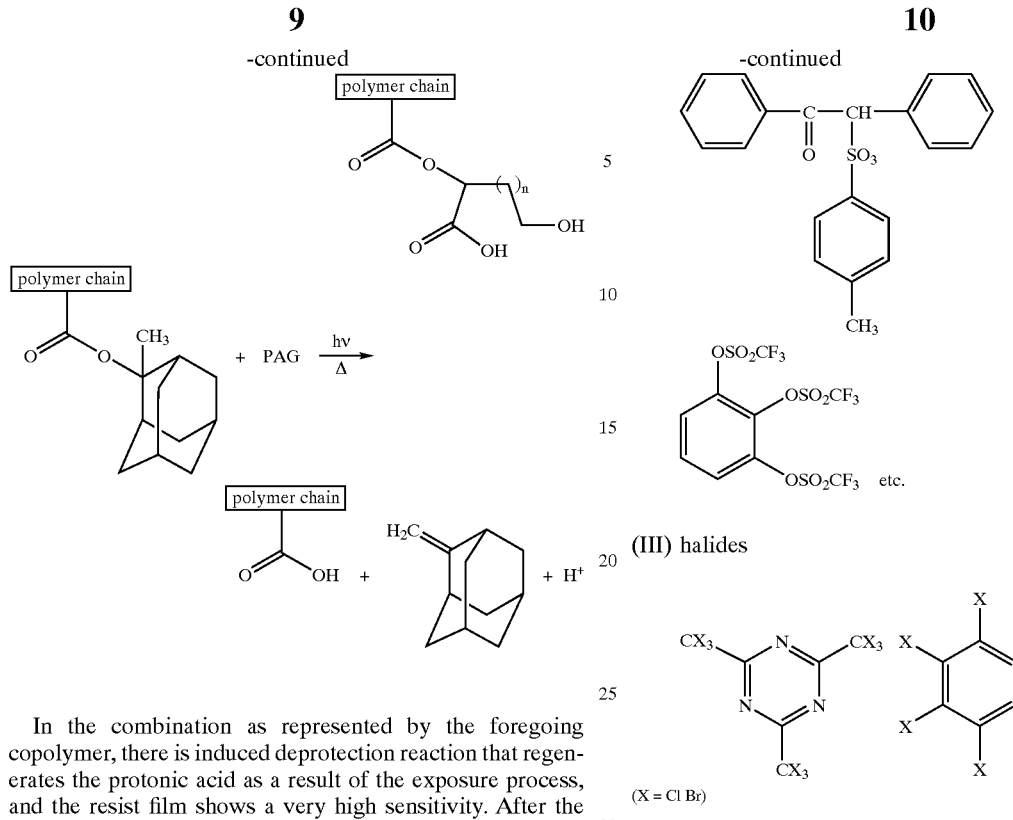

In the combination as represented by the foregoing copolymer, there is induced deprotection reaction that regenerates the protonic acid as a result of the exposure process, and the resist film shows a very high sensitivity. After the deprotection of the protected group, a carboxylic acid is generated. As the other lactone part is also soluble to alkalis, the exposed part of the resist film changes to be soluble to a basic aqueous solution. Thus, by applying a developing process conducted in a basic aqueous solution, a positive pattern is obtained in which the exposed part is dissolved. As such a developing process employs a change of the polarity occurring in the resist film, the pattern thus formed is substantially free from swelling.

In the chemical amplification resist of the present invention, it should be noted that it is possible to use a conventional PAG used in a chemical amplification resist for radiation sources such as far ultraviolet, vacuum ultraviolet or X-rays. While not limited, the PAG for use in the present invention includes the following:

(I) onium salts having a formula

wherein R represents a substitutional or non-substitutional benzene ring or alicyclic group, while X represents $BF_4$, $PF_6$, $AsF_6$, $SbF_6$, $CF_3SI_3$, $ClO_4$, and the like.

(II) sulfonic acid ester

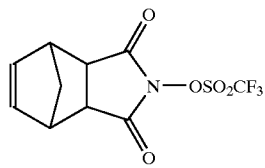

(III) halides (X = Cl Br)

The PAG noted above may be used in the resist composition of the present invention with various proportions. A proportion of 0.1–50 wt % (with respect to the polymer weight), more preferably 1–15 wt %, is recommended. In the case of the resist composition of the present invention, it is preferable to adjust the structure of the polymer as well as the structure and proportion of the PAG such that the resist film shows an absorbance of 1.75 or less.

It should be noted that the resist composition of the present invention is advantageously used in the form of a resist solution in which the foregoing acid-sensitive polymer and the PAG are dissolved into an organic solvent. The organic solvent may be selected, although not limited, from: ethyl lactate, methylamylketone, methyl-3-methoxypropionate, ethyl-3-ethoxypropionate, and propyleneglycolmethylether acetate. Further, two or more solvents may be mixed. While the proportion of the solvent with regard to the polymer is not limited, it is preferable to optimize the proportion such that a suitable viscosity for a successful spin coating process is obtained.

The resist solution thus formed may further contain an additional, auxiliary solvent. Such an auxiliary solvent is not necessary when the resist film is formed uniformly as a result of the spin coating process. On the other hand, when the uniformity of the coated resist film is poor, the quality of the resist film can be improved by adding such an auxiliary solvent to the foregoing primary solvent generally within the proportion of 1–30 wt %, more preferably 10–20 wt %. For the auxiliary solvent, a solvent selected from butyl acetate, γ(gamma)-butylolactone, propyleneglycol methylether, and the like may be used.

The present invention further provides a process of forming a positive resist pattern on a substrate by using the foregoing resist composition. The formation of the resist pattern can be achieved as follows.

First, a resist film is formed using the resist composition of the present invention on a substrate. The substrate may be a substrate used commonly in the fabrication of semiconductor devices, or the like, and includes a Si substrate, a glass substrate, a non-magnetic ceramic substrate, and the like. The substrate may carry thereon various additional layers such as a $SiO_2$ film, metal interconnection layer, interlayer insulation film, magnetic layer, and the like. Further, the substrate may carry thereon various interconnection patterns and circuit patterns. Further, the substrate may be the one that has been subjected to a hydrophobic processing for improving the adhesion of the resist film. Such a hydrophobic processing may be conducted according to the well established process that uses 1,1,1,3,3,3-hexamethyl disilazane (HMDS).

The application of the resist composition is achieved by merely applying the resist solution directly on the substrate according to a commonly practiced process such as a spin-coating process, a rolling process, a dipping process, and the like. Among others, the spin-coating process is most convenient, and the resist film may be formed with a thickness of 0.1–200 μm. In the case of the exposure process conducted by using a KrF or an ArF excimer laser, it is preferable to set the thickness of the resist film in the range of 0.1–5 μm. Further, the thickness of the resist film can be changed as necessary, depending on the particular application of the resist.

The resist film thus formed on the substrate is subjected to a prebaking process before exposing the resist film to the exposure radiation. The prebaking process is preferably conducted at a temperature of 60–180° C. for a duration of 30–120 seconds. Such a prebaking process can be achieved by using the heating means that is used commonly in the resist process. For example, the prebaking process may be conducted by using a hot plate, an infrared oven, or a microwave oven.

After the prebaking process, the resist film is exposed in an exposure system. The exposure system may be any of optical exposure systems including far ultraviolet and deep ultraviolet exposure system, an X-ray exposure system, an electron beam exposure system, and the like. In the resist composition of the present invention, it is particularly advantageous to use a KrF excimer laser with the wavelength of 248 nm or an ArP excimer laser with the wavelength of 193 nm. In the description of the present invention, however, it should be noted that the phrase "radiation" encompasses any radiation produced by any radiation source noted above.

After the exposure process, the resist film is subjected to a PEP process, to induce a deprotection reaction of the protective group, while using the protonic acid as a catalyst. The PEB process can be achieved just like the prebaking process as long as the heat treatment is conducted within the range in which the deprotection reaction proceeds sufficiently. For example, the PEB process may be conducted at the temperature of 60–180° C. for 30–120 seconds. The condition of the PEB process may be adjusted depending on the desired pattern size, pattern profile, and the like.

After the PEB process, the resist film is developed in a basic aqueous solution. The basic aqueous solution may be applied to the resist film as a developer by using a developing apparatus, which may be any of a spin developer, a dip developer or a spray developer. The developer may be any of an aqueous solution of a Group I or Group II metal element or an aqueous solution of an organic salt free from a metal ion such as tetraalkylammonium hydroxide, wherein it is particularly preferable to use an aqueous solution of tetramethylammonium hydroxide (TMAH) that does not contain a metal element. In order to improve the efficiency of developing, it is also possible to add various additives to the developer such as a surfactant.

As a result of such a developing process, the exposed area of the resist is dissolved, and the unexposed area of the resist remains as a resist pattern.

Hereinafter, various embodiments of the present invention will be described with regard to the synthesis of the acid-sensitive polymer, preparation of the resist composition and formation of the resist pattern. The embodiments below, however, are only examples and the present invention is by no means limited to these specific embodiments.

First Embodiment

Synthesis of γ-Butylolactone-2-yl Methacrylate

A three-neck flask of 200 ml size is dried thoroughly and filled with $N_2$, after connecting thereto a dropping funnel, a calcium chloride tube and a $N_2$ supply tube at respective necks. Next, 50 ml of dry methylene chloride, 5.0 g (48.9 mmol) of 2-hydroxy-γ(gamma)-butylolactone, and 5.45 g (53.9 mmol) of dry triethylamine are introduced into the three-neck flask and stirred in an $N_2$ atmosphere at 0° C. by using a teflon-coated stirrer bar.

Next, 5.11 g (48.9 mmol) of methacryloyl chloride previously held in the dropping funnel is introduced by a dropping process conducted for 1 hour, and the liquid thus obtained is stirred at a room temperature for 2 hours. The resultant solution is then taken into a separating funnel of a 300 ml size, and the solution thus taken is washed with 100 ml of water, followed by washing with a saturated sodium chloride water. Thereby, the water layer is extracted three times with methylene chloride, and the extracts are added to the organic layer. The organic layer thus collected is then dried over anhydrous sodium sulfate, and filtered through a filter paper. As a result of the filtering, a brownish oil is obtained, and the brownish oil is purified by a silica gel column chromatography. As a result of the purification, a colorless transparent oil is obtained as a target product.

yield 7.25 g (78.1%).

$^1$H NMR($CDCL_3$, d, J in Hertz): 1.98(3H,s), 2.35(1H,m), 2.76(1H,m), 4.35(1H,m), 4.51(1H,m), 5.43(1H,t,J=6.5), 5.70(1H,s), 6,22(1H,s), wherein s in the bracket represents singlet, d represents doublet and m represents multiple.

Second Embodiment

Synthesis of a Copolymer of γ-Butylolactone-2-yl Methacrylate and 2-Methyl-2-Adamantyl Methacrylate A flask of 100 ml size is used to hold 3 g (17.6 mmol) of γ(gamma)-butylolactone-2-yl methacrylate, 3.51 g (14.4 mmol) of 2-methyl-2-adamantyl methacrylate, 788 mg (4.8mmol) of AIBM (15 mol %) and 10.7 ml of dioxane, together with a magnetic stirrer bar, and the mixture in the flask is stirred by using the magnetic stirrer bar in a dry $N_2$ environment at a temperature of 70° C. for 8 hours. A resultant viscous fluid is added dropwise in 800 ml of methanol, to form a precipitate.

Next, the precipitate is filtered by using a glass filter and the resin thus filtered is dried in a vacuum oven at 45° C. for 6 hours. The resin thus obtained is then dissolved into THF. After repeating the precipitation purification twice by using methanol, the resin is dried in the vacuum oven at 45° C. for 18 hours. As a result, a whitish resin powder is obtained with a yield of 5.35 g (82.2%).

By conducting a $^1$HNMR analysis, it was confirmed that the resin contains lactone and adamantyl with a ratio of 51: 49.

Mw:14,900, Mw/Mn=1.83 (in terms of standard polystyrene)

The result of an IR analysis was as follows.

IR(KRS-5, $cm^{-1}$): 2913, 1791, 1737, 1261, 1147, 1103

Third Embodiment

Resist Pattern Formation

The copolymer synthesized in the second embodiment is dissolved into PGMEA (propyleneglycol methylether acetate) to form a 15 wt % solution. The solution is further added with 8 wt % γ(gamma)-butylolactone as the auxiliary solvent. The solution thus obtained is further added with 2 wt % of triphenylsulfonium trifluorosulfonate for complete dissolution.

The resist solution thus obtained is then filtered by a teflon membrane filter of 0.2 μm size and spun onto a Si substrate processed by HMDS, to form a resist film. The resist film thus formed is subjected to a prebaking process at 120° C. for 60 seconds, and a resist film having a thickness of 0.7 μm.

The resist film thus obtained is then subjected to an exposure process, in which the exposure process is conducted by a KrF excimer laser stepper having a numerical aperture of 0.45.

After the exposure, the resist film is subjected to a PEB process at a temperature of 110° C. for 60 seconds, and a resist pattern is developed by applying a 2.38% TMAH (tetramethyl ammonium hydroxide) developer. After the development, the resist pattern was rinsed by a deionized water.

It was confirmed that, as a result of the exposure conducted with a dose of 30.0 mJ/cm$^2$, a line-and-space pattern of 0.25 μm pitch is successfully resolved.

Fourth Embodiment
Resist Pattern Formation

The resist solution of the third embodiment is applied on a hydrophobic Si substrate surface processed by HMDS, similarly to the case of the third embodiment, to form a resist film with a thickness of 0.4 μm. The resist film is then subjected to an exposure process conducted by using an ArF excimer laser stepper having a numerical aperture (NA) of 0.55. After the exposure, the resist film is subjected to a PEB process conducted at 100° C. for 60 seconds, followed by a developing process using a 2.38% TMAH developer, to form a resist pattern. The resist pattern thus formed is rinsed by a deionized water.

According to the experiment of the present embodiment, it was confirmed that a line-and-space pattern of 0.20 μm pitch is successfully resolved when an exposure dose of 26 mJ/cm$^2$ is used.

Fifth Embodiment
Formation of a Resist Pattern

The copolymer synthesized in the foregoing second embodiment is dissolved to form a 15wt % PGMEA solution, and a resist solution is formed by adding 2 wt % of diphenyliodenium trifluoromethanesulfonate with respect to the resin, to the foregoing PGMEA solution.

The resist solution thus obtained is applied on a surface of a Si substrate processed by HMDS by a spin coating process. After a prebaking process conducted at 120° C. for 60 seconds, a resist film having a thickness of 0.4 μm is obtained.

The resist film is then subjected to an exposure process in an ArF exposure system, followed by a PEB process conducted at 100° C. for 60 seconds.

The resist film thus exposed is then developed by a 2.38%. TMAH developer, and rinsed by a deionized water.

According to the present embodiment, it was confirmed that a line-and-space pattern of 0.20 μm pitch is successfully resolved when an exposure dose of 20 mJ/cm$^2$ is used.

Sixth Embodiment
Synthesis of a Copolymer of γ(gamma)-Butylolactone-2-yl Methacrylate and Isobornyl Methacrylate A flask of 100 ml size is used to hold 5.0 g (29.4 mmol) of τγ-butylolactone-2-yl methacrylate, 6.54 g (29.4 mmol) of isobornyl methacrylate, 19.6 ml of dioxane and 1.44 g (8.8 mmol) of azobisisobutylonitrile (AIBN), together with a teflon-coated stirrer bar, and the mixture in the flask is stirred by using the stirrer bar in an N$_2$ environment at a temperature of 70° C. for 8 hours. A resultant fluid is diluted by THF and added dropwise into 1 l of methanol containing a small amount of hydroquinone, to form a precipitate.

Next, the precipitate thus formed is filtered by using a glass filter and dried under a 0.1 mmHg pressure at 45° C. for 16 hours. The resin thus obtained is then dissolved again into THF, and the foregoing filtering and drying process are repeated twice. As a result of the foregoing process, a whitish resin powder is obtained.

By conducting a $^1$HNMR analysis, it was confirmed that the resin contains lactone and isobornyl with a ratio of 49:51. The copolymer thus obtained shows a transmittance of 96% at 248 nm and a transmittance of 65% at 193 nm, provided that the polymer film is formed on an SiO$_2$ substrate with a thickness of 1 μm.

yield 8.61 g (80%).

Mw:15,400 (in terms of standard polystyrene) dispersion 1.82

IR(KRS-5, cm$^{-1}$): 2961, 1792, 1736, 1250, 1163, 1102

Seventh Embodiment
Formation of Resist Pattern

The copolymer synthesized in the previous sixth embodiment is dissolved to form a 145 wt % PGMEA solution. Further, a resist is formed by adding 2 wt % of triphenylsulfonium trifluoromethanesulfonate with respect to the resin, to the foregoing PGMEA solution. The solution further contains 6 wt % of γ(gamma)-butylolactone as an auxiliary solvent.

The resist solution thus obtained is then applied on a surface of a Si substrate processed by HMDS and subjected to a prebaking process conducted at 120° C. for 60 seconds. Thereby, a resist film having a thickness of 0.4 μm is formed.

The resist film is then subjected to an exposure process conducted by an ArF excimer laser exposure system, followed by a PEB process conducted at 100° C. for 60 seconds. After a developing process conducted by a 2.38% TMAH developer, followed by a rinse process conducted by a deionized water, a line-and-space pattern of 0.20 μm pitch is successfully resolved by using an exposure dose of 32 mJ/cm$^2$.

FIGS. 1A–1F show a fabrication process of a semiconductor device conducted by a resist composition of the present invention.

Referring to FIG. 1A, a gate oxide film 2 is formed on a surface of a Si substrate, and a polysilicon layer 3 is deposited thereon by a CVD process. The polysilicon layer 3 thus formed is given a conductivity by introducing thereinto an n-type impurity element such as P. After the formation of the polysilicon layer 3, a WSi film 4 is formed further thereon by a sputtering process or a CVD process.

Figure 1B:
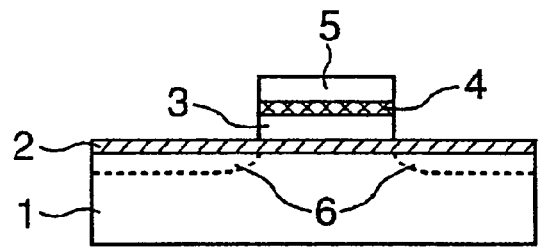

Next, in the step of FIG. 1B, the resist composition of any of the foregoing embodiments is applied on the structure of FIG. 1A, to form a resist film. The resist film thus formed is first subjected to a prebaking process and further subjected to an exposure process conducted by a KrF excimer laser exposure system. After the exposure, the resist film is subjected to a PEB process, followed by a developing process conducted by using an alkaline developing liquid. As a result of the developing process, a resist pattern 5 having a minimum pattern width of 0.25 μm is successfully formed.

By using the resist pattern 5 thus formed as a mask, the WSi layer 4 and the polysilicon layer 5 underneath are etched successively to form a gate electrode.

Next, an ion implantation process is conducted while using the gate electrode as a mask, to form a N$^-$-type diffusion region 6 in the substrate 1.

Figure 1C:
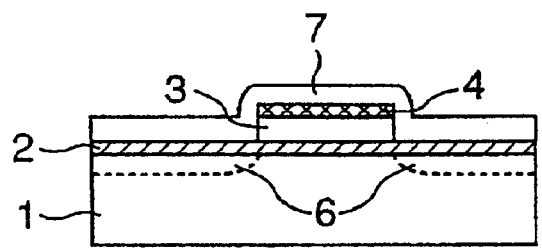

Next, in the step of FIG. 1C, the resist pattern is removed and an SiO$_2$ film 7 is formed on the entire surface of the structure of FIG. 1B by a CVD process.

Figure 1D:
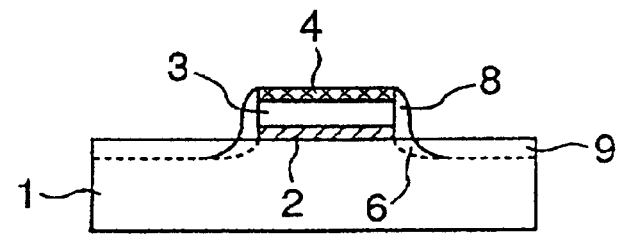

The $SiO_2$ film 7 is then subjected to an anisotropic etching process acting generally perpendicularly to the principal surface of the substrate 1 in the step of FIG. 1D, to form a side wall insulation film 8. Further, an ion implantation process is conducted while using the gate electrode and the side wall insulation film as a mask, to form $N^+$-type diffusion region 9 in the substrate 1.

Figure 1E:
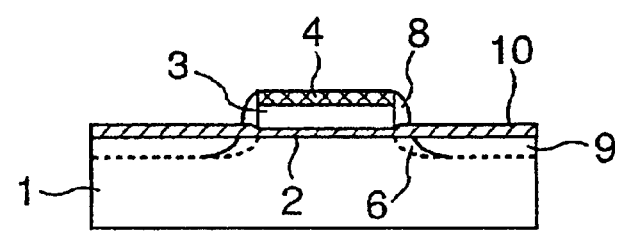
Figure 1F:
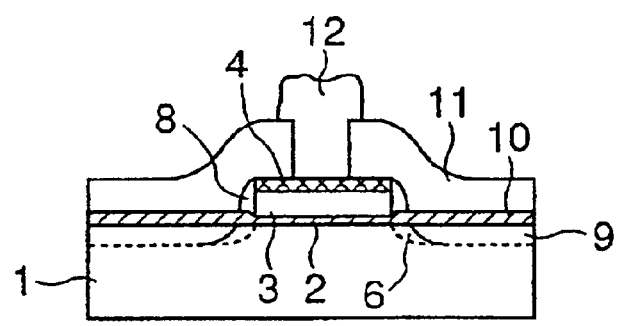

The $N^+$-type diffusion region 9 thus formed is then activated in the step of FIG. 1E by conducting a thermal annealing process in an $N_2$ atmosphere, followed by a thermal oxidation process to form an oxide film 10 on the exposed surface of the diffusion region 9.

Further, in the step of FIG. 11F, an interlayer insulation film 11 is deposited on the structure of FIG. 1E and a resist film of the present invention is applied on the interlayer insulation film 11 thus formed.

After a prebaking process of the resist film, an exposure process for exposing a contact hole corresponding to the gate electrode is conducted by using an ArF excimer laser exposure system. After a PEE process, the resist film is subjected to a developing process conducted by using an alkaline developing liquid, and a minute contact hole having a diameter of 0.20 μm is successfully obtained. Further, the resist pattern is removed, and an Al wiring pattern 12 is provided on the interlayer insulation film 11 in contact with the gate electrode through the contact hole thus formed.

In the present invention, it should be noted that the resist film, containing alicyclic ester group which has a small optical absorption to a short wavelength optical radiation and a high dry-etching resistance, shows simultaneously a strong adhesion to the underlying layer 4 due to the existence of the lactone part that has a large dipole moment.

In the resist composition of the present invention, the lactone part is formed from a low cost source of 2-hydroxy-γ(gamma)-butylolactone. Further, the resist composition can be formed with a higher synthetic yield than in the case in which mevalonic lactone is used. As demonstrated in the experiments described before, it should be noted that the monomers and copolymer are synthesized in the present invention with a yield exceeding 80%.

Further, the present invention is not limited to the embodiments described heretofore, but various variations and modifications may be made without departing from the scope of the invention.

What is claimed is:

1. An-acid-sensitive polymer compound, comprising:
   a film-forming polymer;
   a carboxyl group bonding to a side chain of said polymer main chain, said carboxyl group having a protective group; and
   an additional acidic functional group bonding to a side chain of said polymer main chain, said acidic functional group having an acid-cleavable protective group;
   said carboxyl group having, as said protective group, a lactone structure represented by a formula

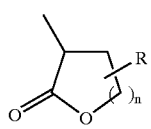

wherein n is an integer of 1–4, and R represents any of a hydrogen atom, an alkyl group, an alkoxyl group or an alkoxycarbonyl group and bonding to an arbitrary position of said lactone structure excluding a second position forming an ester bonding.

2. An acid-sensitive polymer compound as claimed in claim 1, wherein said lactone part is formed of 2-hydroxy-γ(gamma)-butylolactone.

3. An acid-sensitive polymer compound as claimed in claim 1, wherein said acid-sensitive polymer includes a monomer unit selected from a group consisting of acrylate and methacrylate monomer unit, a vinyiphenol monomer unit and an N-substituted maleimide monomer unit.

4. An acid-sensitive polymer compound as claimed in claim 1, wherein said additional acidic functional group includes an additional carboxyl group having an acid-cleavable protective group, said acid-cleavable protective group having a formula of

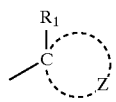

wherein $R_1$ represents an alkyl group having a straight chain or a branched chain including 1–4 carbon atoms, said alkyl group being any of a substituted group and an unsubstituted group, and wherein $Z_1$ represents a plurality of atoms necessary to complete an alicyclic hydrocarbon group together with the carbon atoms connected to $R_1$.

5. An acid-sensitive polymer compound as claimed in claim 1, wherein said additional functional group includes a monomer unit having an ester group, said ester group including a polycyclic alicyclic hydrocarbon part that causes a deprotection in response to an acid produced by a photoacid generator.

6. An acid-sensitive polymer compound as claimed in claim 5, wherein said polycyclic alicyclic hydrocarbon part includes an adamantyl group or a norbornyl group.

7. An acid-sensitive polymer compound as claimed in claim 4, wherein said additional carboxyl group having a formula of:

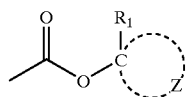

wherein $R_1$ represents an alkyl group having a straight chain or a branched chain including 1–4 carbon atoms, said alkyl group being any of a substituted group and an unsubstituted group, and wherein $Z_1$ represents a plurality of atoms necessary to complete an alicyclic hydrocarbon group together with the carbon atoms connected to $R_1$.

8. A resist composition, comprising:
   an acid-sensitive film-forming polymer insoluble to an alkaline solution; a carboxyl group bonding to a side chain of said polymer's main chain, said carboxyl group having a protective group; and an additional acidic functional group bonding to a side chain of said polymer main chain, said acidic functional group having an acid-cleavable protective group; said carboxyl group having, as said protective group, a lactone structure represented by a formula

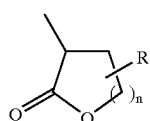

wherein n is an integer of 1–4, and R represents any of a hydrogen atom, an alkyl group, an alkoxyl group or an alkoxycarbonyl group and bonding to an arbitrary position of said lactone structure excluding a second position forming an ester bonding; and a photoacid generator causing a decomposition in response to an absorption of a radiation, said photoacid generator releasing an acid that causes a deprotection of said acid-cleavable protective group in response to said decomposition;

said resist composition becoming soluble to said alkaline solution after said acid-cleavable protective group has caused said deprotection.

9. A resist composition as claimed in claim 8, wherein said lactone part is formed of 2-hydroxy-γ(gamma)-butylolactone.

10. A resist composition as claimed in claim 8, wherein said acid-sensitive polymer includes a monomer unit selected from a group consisting of acrylate and methacrylate monomer unit, a vinylphenol monomer unit and an N-substituted maleimide monomer unit.

11. A resist composition as claimed in claim 8, wherein said additional acidic functional group includes an additional carboxyl group having an acid-cleavable protective group, said acid-cleavable protective group having a formula of

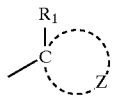

wherein $R_1$ represents an alkyl group having a straight chain or a branched chain including 1–4 carbon atoms, said alkyl group being any of a substituted group and an unsubstituted group, and wherein $Z_1$ represents a plurality of atoms necessary to complete an alicyclic hydrocarbon group together with the carbon atoms connected to $R_1$.

12. A resist composition as claimed in claim 8, wherein said additional functional group includes a monomer unit having an ester group, said ester group including a polycyclic alicyclic hydrocarbon part that causes a deprotection in response to an acid produced by a photoacid generator.

13. A resist composition as claimed in claim 12, wherein said polycyclic alicyclic hydrocarbon part includes an adamantyl group or a norbornyl group.

14. A resist composition as claimed in claim 11, wherein said additional carboxyl group having a formula of:

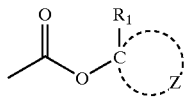

wherein $R_1$ represents an alkyl group having a straight chain or a branched chain including 1–4 carbon atoms, said alkyl group being any of a substituted group and an unsubstituted group, and wherein $Z_1$ represents a plurality of atoms necessary to complete an alicyclic hydrocarbon group together with the carbon atoms connected to $R_1$.

15. A resist composition as claimed in claim 8, wherein said resist composition has an absorbance of 1.75 or less when provided on a silicon oxide substrate in the form of a resist film.

16. A resist composition as claimed in claim 8, further comprising a solvent selected from a group consisting of: ethyl lactate, methylamylketone, methyl-3-methoxypropionate, ethyl-3-ethoxypropionate, propyleneglycol methylether acetate, and a mixture thereof.

17. A resist composition as claimed in claim 16, further including a solvent selected from a group consisting of butyl acetate, γ(gamma)-butylolactone and propyleneglycol methylether as an auxiliary solvent.

18. A method of forming a resist pattern, comprising the steps of:

applying a resist composition on a substrate to form a resist film, said resist composition comprising:

an acid-sensitive polymer compound insoluble to an alkaline solution, said acid-sensitive polymer compound comprising a film-forming polymer; a carboxyl group bonding to a side chain of said polymer main chain, said carboxyl group having a protective group; and an additional acidic functional group bonding to a side chain of said polymer main chain, said acidic functional group having an acid-cleavable protective group; said carboxyl group having, as said protective group, a lactone structure represented by a formula

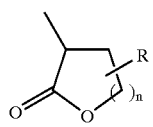

wherein n is an integer of 1–4, and R represents any of a hydrogen atom, an alkyl group, an alkoxyl group and an alkoxycarbonyl group and bonding to an arbitrary position of said lactone structure excluding a second position forming an ester bonding; and a photoacid generator causing a decomposition in response to an absorption of a radiation, said photoacid generator releasing an acid that causes a deprotection of said acid-cleavable protective group in response to said decomposition;

said resist composition becoming soluble to said alkaline solution after said acid-cleavable protective group has caused said deprotection;

exposing said resist film to an exposure radiation that induces said decomposition in said photoacid generator; and developing said resist film, after said process of exposing, by a basic solution.

19. A method as claimed in claim 18, wherein said step of forming said resist film includes a step of applying a solution of said resist composition on said substrate with a thickness of 0.1-2 μmm.

20. A method as claimed in claim 18, wherein said step of exposing said resist film is conducted by a KrF excimer laser.

21. A method as claimed in claim 18, wherein said step of exposing said resist film is 15 conducted by an ArF excimer laser.

22. A method as claimed in claim 18, wherein said step of developing is conducted by using an alkaline aqueous solution.

23. A method of fabricating a semiconductor device, comprising the steps of:

applying a resist composition on a substrate to form a resist film, said resist composition comprising:

an acid-sensitive polymer compound insoluble to an alkaline solution, said acid-sensitive polymer compound comprising a film-forming polymer; a carboxyl group bonding to a side chain of said polymer main chain, said carboxyl group having a protective group; and an additional acidic functional group bonding to a side chain of said polymer main chain, said acidic functional group having an acid-cleavable protective group; said carboxyl group having, as said protective group, a lactone structure represented by formula

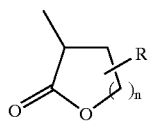

wherein n is an integer of 1–4, and R represents any of a hydrogen atom, an alkyl group, an alkoxyl group or an alkoxycarbonyl group and connected to an arbitrary position of said lactone structure excluding a second position forming an ester bonding; and a photoacid generator causing a decomposition in response to an absorption of a radiation, said photoacid generator releasing an acid that causes a deprotection of said acid-cleavable protective group in response to said decomposition;

said resist composition becoming soluble to said alkaline solution after said acid-cleavable protective group has caused said deprotection;

exposing said resist film to an exposure radiation that induces said decomposition in said photoacid generator;

developing said resist film, after said step of exposure, by a basic solution to form a resist pattern; and etching said substrate while using said resist pattern as a mask.

24. A method as claimed in claim 23, wherein said step of forming said resist film includes a step of applying a solution of said resist composition on said substrate with a thickness of 0.1–2 $\mu$m.

25. A method as claimed in claim 23, wherein said step of exposing said resist film is conducted by a KrF excimer laser.

26. A method as claimed in claim 23, wherein said step of exposing said resist film is conducted by an ArF excimer laser.

27. A method as claimed in claim 23, wherein said step of developing is conducted by using an alkaline aqueous solution.

* * * * *